United States Patent [19]

Havens

[11] 4,011,527
[45] Mar. 8, 1977

[54] TEMPERATURE COMPENSATED MICROWAVE CAVITY TRANSISTOR OSCILLATOR

[75] Inventor: Richard Calvin Havens, Scottsdale, Ariz.

[73] Assignee: Motorola, Inc., Chicago, Ill.

[22] Filed: Aug. 28, 1975

[21] Appl. No.: 608,422

[52] U.S. Cl. .......................... 331/117 D; 331/101; 331/107 R; 333/83 T
[51] Int. Cl.² ............................................ H03B 5/18
[58] Field of Search .............. 331/117 D, 107, 101; 333/82 BT, 83 T

[56] References Cited

UNITED STATES PATENTS

| 3,160,825 | 12/1964 | Derr | 333/83 T |
| 3,271,698 | 9/1966 | Adams | 331/117 D |
| 3,733,567 | 5/1973 | Johnson | 333/82 BT |

OTHER PUBLICATIONS

Electronic Engineering, Jan. 1974, pp. 54–56, 58.

*Primary Examiner*—John Kominski
*Attorney, Agent, or Firm*—Michael D. Bingham

[57] ABSTRACT

A temperature compensated cavity oscillator comprising a resonant coaxial cavity of which the outer conductor is constructed of dissimilar materials. The end walls and adjacent portion of the outer conductor of the coaxial cavity are made of a first conductive material having a first temperature coefficient of expansion. Interposed between the first conductive material of the outer conductor, the middle portion of the outer conductor is made from a second conductive material having a second temperature coefficient of expansion. A tuning rod is displaced through the middle portion of the cavity and capacitively coupled to a center coaxial conductor to provide mechanical tuning of the oscillation frequency and for varying the frequency of the cavity with temperature such that the temperature characteristics of the oscillating element are compensated to produce a substantially stable oscillating frequency.

3 Claims, 2 Drawing Figures

TEMPERATURE COMPENSATED MICROWAVE CAVITY TRANSISTOR OSCILLATOR

BACKGROUND OF THE INVENTION

This invention relates to temperature compensated solid state oscillators and more particularly to a temperature compensated microwave transistor cavity oscillator.

Conventional solid state oscillators employing an oscillating element disposed in a resonant cavity produce an oscillation frequency which is dependent on the physical dimensions of the oscillating element as well as the temperature characteristics of the same, and also to the bias potential applied thereto. Moreover, the oscillation frequency is also dependent on the physical dimensions of the cavity which vary with temperature. For example, with an increase in temperature the cavity size increases which therefore causes the oscillation frequency to decrease, the opposite effect occurring if the operating temperature should decrease.

Heretofore prior techniques to reduce the effects of dimensional changes of the cavity and the frequency variations caused thereby have been to construct the cavity of a material having a very small temperature coefficient of expansion, for example, Invar. However, frequency variations caused by the temperature characteristics of the oscillating element are still significant and are not compensated for by the aforedescribed cavity construction.

Another prior art method for temperature compensating an oscillator comprising a negative resistance diode (Gunn or Impatt) is disclosed in U.S. Pat. Nos. 3,623,146 and 3,665,341, both to Kaneko et. al. Here the oscillating element is disposed within a wave guide cavity having one end wall of which is a moveable plate. The moveable plate is affixed to one end of a dielectric rod having a large coefficient of linear expansion. Thus, the cavity dimension is varied over temperature in a manner to temperature compensate the oscillator.

The present invention provides a solution wherein the physical dimensions of the cavity are substantially held constant while at the same time the temperature dependent characteristics of a microwave transistor are compensated for over a wide temperature range in order to provide a very stable oscillating frequency. Thus, a solution to the problems of temperature compensating a resonant cavity oscillator is provided as will hereinafter be described.

SUMMARY OF THE PRESENT INVENTION

Accordingly, it is the principle object of the present invention to provide an improved temperature compensated microwave cavity oscillator.

In accordance with one feature of the invention, a solid state oscillating element is disposed in a resonant cavity, through one end wall of the cavity. The spacially opposed end walls and adjacent outer conductor portions of the cavity are fabricated of a first conductive material and include an intermediate portion fabricated of a second conductive material. The first conductive material is selected to have a very small temperature coefficient of expansion with respect to the second conductive material whereby the physical dimensions of the cavity are essentially held constant with variations in temperature. A coaxial center conductor disposed reentrantly within the cavity is connected at one end thereof to the solid state oscillating element with a first bias potential being applied through the coaxial center conductor to the solid state oscillating element. The coaxial center conductor is constructed such that a radio frequency (RF) choke is provided for preventing leakage of the radio frequency power onto the bias potential source. A tuning rod is disposed through the portion of the outer conductor formed of the second conductive material and is capacitively coupled to the coaxial center conductor utilizing a capacitive gap. With variations in temperature, because the tuning rod is disposed in the second conductive material which has a greater temperature coefficient expansion than the first conductive material, the capacitive gap between the tuning rod and the center coaxial conductor will vary in order to conjugately match the temperature characteristics of the solid state oscillating element such that frequency stability is ensured. The output of the oscillator is provided by a capacitive coupled probe.

DETAILED DESCRIPTION OF THE PREFERRED EMBODIMENT

Figure 1:
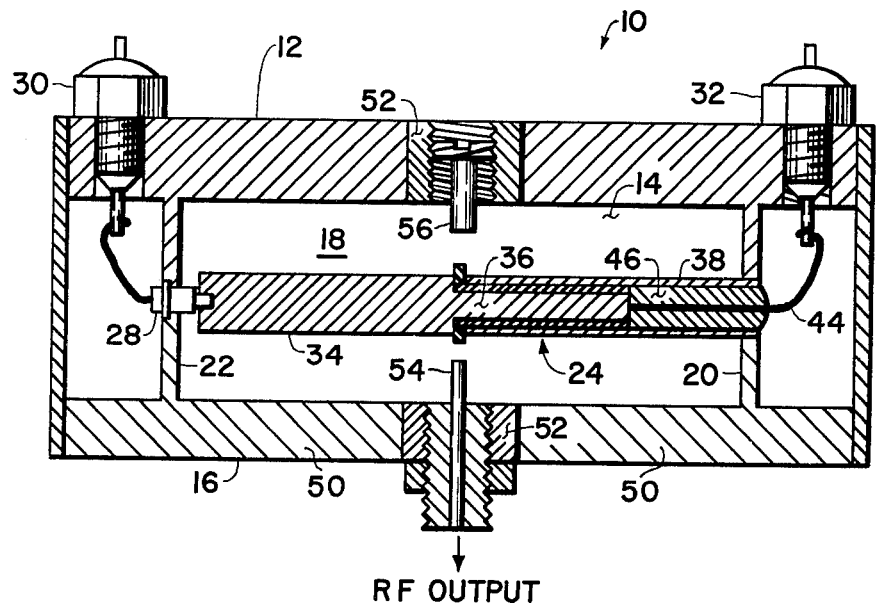
FIG. 1 is a cross-sectional view of the microwave oscillator of the embodiment of the present invention.
Figure 2:
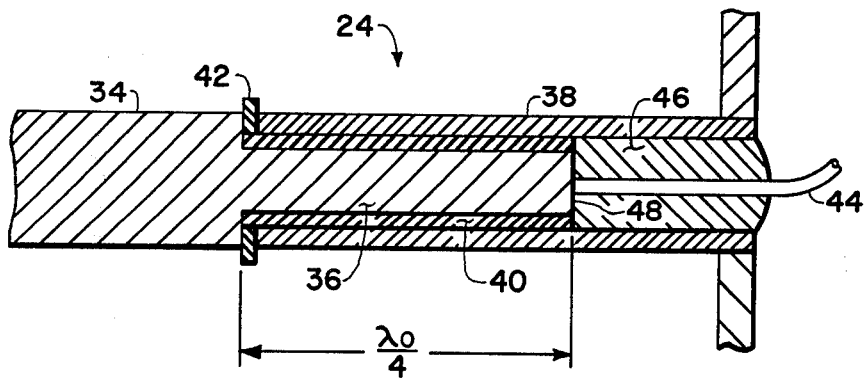
FIG. 2 is an enlarged cross-sectional view of the coaxial center conductor of the embodiment of the present invention.

Referring to FIGS. 1 and 2 there is shown microwave oscillator 10 comprising housing 12 within which is formed a resonant coaxial cavity 14. Resonant coaxial cavity 14 includes outer conductor 16 formed by housing 12 with a cylindrical internal bore or chamber 18. End walls 20 and 22 define the lateral dimensions of cavity 14 which includes inner coaxial conductor 24 axially disposed of chamber 18 between the end walls. For clarity, minor structural details such as nuts, bolts and welds and so forth are not shown.

Solid state oscillating element 28, such as a microwave transistor which is packaged in a conventional coaxial package is positioned in end wall 22 and has its collector electrode attached to one end of center conductor 24. The base electrode of transistor 28 is grounded to housing 12 with the emitter electrode being coupled to an emitter bias potential, $V_{EB}$, through radio frequency (RF) filter 30. Collector bias potential, $V_{CB}$ is applied through RF filter 32 and center conductor 24 to the collector electrode of the transistor. The purpose of RF filters 30 and 32 are to prevent the high frequency energy produced in cavity 14 from being impressed onto the direct current (DC) bias lines.

Coaxial inner conductor 24, shown in greater detail in FIG. 2, comprises cylindrical conductor end portion 34 which has a turned down portion 36; and hollow sleeve conductor 38. Sleeve conductor 38 is disposed about turned down portion 36 and is DC insulated therefrom by dielectric sleeving 40 and dielectric annular ring 42. An inductive wire lead 44 is connected between conductor 36 and one terminal of RF filter 32 for applying collector bias potential to transistor 28 as previously discussed. Inductive lead 44 is rigidly held within sleeve 38 by RF loading material 46.

Coaxial center conductor 24 provides a unique structure for applying DC bias to the collector of the oscillating element while presenting a RF short to the generated high frequency energy to prevent leakage thereof from the oscillator. Turned down portion 36 of coaxial center conductor 24 is terminated in an essentially RF open circuit at end 48 and is a quarter wave length ($\lambda_o/4$) at the desired oscillating frequencies so that a RF short circuit is effected thereat, at the gap occupied by annular dielectric ring 42. The effective RF short provides a RF choke to the generated RF energy to prevent leakage of the RF energy from oscillator 10.

Outer conductor 16 is shown as being comprised of two dissimilar metals for enhancing the frequency stability characteristics of oscillator 10. End walls 20 and 22 and portions 50 which are adjacent thereto are formed of a metal having a small temperature coefficient of expansion, for example, Invar. Center portion 52, interposed between portions 50, are formed of a material having a different and higher temperature coefficient of expansion, which may be aluminum, for example.

Oscillator 10 is basically a common base, Clapp type transistor oscillator which is known in the art. The normal collector inductance and variable capacitance usually found in the Clapp type oscillator are provided, in this case, by resonant coaxial cavity 14. The electrical length of resonant coaxial cavity 14 is made to be slightly longer than one-half wave length at the desired center frequency of oscillation to conjugately match the collector impedance of transistor 28. Feedback, which is required for oscillation, is provided by the internal transistor collector to emitter capacitance. The RF frequency power output is extracted by capacitive probe 54 which is adjusted in axial length for optimum coupling. Mechanical tuning of the oscillation frequency over a predetermined frequency bandwidth is adjusted by tuning rod 56 which is disposed in aluminum portion 52 and is capacitively coupled to inner coaxial conductor 24.

Frequency stability of oscillator 10 is accomplished in the following manner as will now be discussed. As the ambient temperature varies, temperature compensation is provided by changing the capacitive tuning between tuning rod 56 and center conductor 24 (the gap therebetween). For example, with an increase in temperature the dimension of resonant cavity 18 remains substantially constant because the Invar formed outer conductor has substantially a zero temperature coefficient of expansion. However, intermediate portion 52 of the outer conductor, being made of aluminum, will expand and withdraw tuning rod 56 away from center conductor 24 which increases the capacitive gap therebetween. Thus, the capacitive loading of resonant cavity 24 decreases which will cause an increase in the operating frequency of the oscillator. This increase of resonant frequency is however offset by the temperature characteristics of transistor 28 which would otherwise cause a decrease in the oscillation frequency. Therefore, the combined effect is to cause the frequency of oscillation to remain substantially constant. The opposite effect occurs when the temperature decreases. Further, more compensation is provided when the frequency of oscillation is tuned to the lower end of the frequency bandwidth than at the higher end of the frequency bandwidth which is desired because the temperature characteristics of transistor 28 are more pronounced at the lower frequency end. With tuning rod 56 being inserted further into resonant cavity 24 at the lower end of the frequency bandwidth, more capacitance is developed. Because the gap is quite small, a greater change in frequency relative to the length of the gap is effected at lower frequencies than when the gap between the tuning rod and the center conductor is greater (at the higher frequency). Thus, a smaller change in the expansion of the aluminum intermediate portion and the subsequent withdrawing of tuning rod 56 with an increase in temperature causes a greater change in the frequency of oscillation which therefore, compensates the temperature characteristic of transistor 28.

In a typical example, a C band solid state oscillator has been fabricated as described above which has a frequency stability of better than ±6 megahertz over a 5.2 gigahertz to 5.7 gigahertz mechanical tuning range with a temperature variation from −55° C to +95° C. Approximate size of the oscillator is 1.8 inches by 0.8 inches by 0.05 inches.

Thus what has been disclosed is a temperature compensated microwave cavity transistor oscillator having excellent frequency stability. The oscillator of the preferred embodiment is of simple construction and small size.

What is claimed is:

1. A cavity oscillator, comprising in combination:
    a resonant chamber having lateral side walls of a predetermined dimension and first and second end walls;
    a solid state oscillating element for generating energy at a predetermined frequency, said element being disposed through said first end wall and projecting coaxially into said resonant chamber;
    means for applying a first direct current (dc) bias potential to said oscillating element externally of said resonant chamber;
    output means disposed through side walls of said resonant chamber for extracting power therefrom at said predetermined frequency;
    an inner conductor coaxially disposed in said resonant chamber which includes a cylindrical rod member attached at one end thereof to said oscillating element and a hollow sleeve member disposed through said second end wall of said resonant chamber, said cylindrical member having a turned down portion of a predetermined length and being terminated in a radio frequency (RF) open circuit with said hollow sleeve member being insulatively disposed thereabout, and;
    means for applying a second direct current (dc) bias potential to said oscillating element, said means being disposed within said hollow sleeve member and connected to said turned down portion of said inner conductor; and
    tuning means disposed through said side wall of said resonant chamber and being capacitively coupled to said inner conductor for varying the frequency of the oscillator.

2. The oscillator of claim 1 wherein:
    said side walls of said chamber includes first and second portions fabricated of a thermally stable material and a third portion intermediate of said first and second portions of a thermally unstable material; and
    said output means and said tuning means being disposed in said third portion.

3. The cavity oscillator of claim 1 wherein said solid state oscillating element comprises a transistor having collector, emitter and base electrodes, said collector electrode being coupled to said inner conductor, said emitter electrode being coupled to said means for applying a first dc bias potential and said base electrode being disposed within said first end wall of said resonant chamber.

* * * * *